United States Patent [19]
Jablonsky

[11] Patent Number: 5,753,135
[45] Date of Patent: May 19, 1998

[54] APPARATUS AND METHOD FOR RECOVERING PHOTORESIST DEVELOPERS AND STRIPPERS

[76] Inventor: Julius James Jablonsky, 1610 Hedgewood Rd., Hatfield, Pa. 19440-2146

[21] Appl. No.: 740,025

[22] Filed: Oct. 23, 1996

Related U.S. Application Data

[60] Provisional application No. 60/005,846, Oct. 23, 1995.
[51] Int. Cl.⁶ ..................................................... B44C 1/22
[52] U.S. Cl. ................................................ 216/93; 156/345
[58] Field of Search .......................... 438/725; 216/93, 216/41; 156/345 L; 134/10, 38, 108, 110, 111

[56] References Cited

U.S. PATENT DOCUMENTS

| | | |
|---|---|---|
| 4,069,157 | 1/1978 | Hoover et al. |
| 4,865,742 | 9/1989 | Falletti . |
| 4,982,215 | 1/1991 | Matsuoka .............................. 216/93 X |
| 5,112,491 | 5/1992 | Strantz, Jr. . |
| 5,205,937 | 4/1993 | Bhave et al. . |
| 5,531,889 | 7/1996 | Baron et al. .......................... 216/93 X |

*Primary Examiner*—William Powell
*Attorney, Agent, or Firm*—Howson and Howson

[57] ABSTRACT

In a developing, etching and stripping apparatus, photoresist developing and stripping chemicals are drawn off into separate circulatory paths in each of which they are pumped through a heat exchanger, a series of tangential filters, an ultraviolet contactor and a collection tank. Permeate from the filters is returned to the developing or stripping stage, and solutions with high concentrations of solids are removed from the collection tanks for disposal.

18 Claims, 1 Drawing Sheet

APPARATUS AND METHOD FOR RECOVERING PHOTORESIST DEVELOPERS AND STRIPPERS

CROSS REFERENCE TO RELATED APPLICATION

This is a continuation-in-part of provisional application Ser. No. 60/005,846, filed Oct. 23, 1995.

SUMMARY OF THE INVENTION

This invention relates generally to the management of waste liquids produced in the manufacture of printed circuit boards, semiconductors and other products in processes utilizing photoresist. More particularly, it relates to an apparatus and method for recovering and recycling photoresist developing solutions and/or photoresist stripping solutions.

In the printed circuit, semiconductor, chemical milling, and printing industries, a photosensitive emulsions known as a photoresist is applied to various substrates. A phototool or mask defining a pattern is applied over the photoresist. Exposure of a negative-working photoresist through the mask to radiation, for example ultraviolet light, results in a pattern of hardened polymer emulsion in the exposed area. Positive-working photoresists are also sometimes used, and result in a pattern of hardened photoresist in the non-exposed area.

In either case, following exposure, the articles are typically carried by a conveyor through automated equipment known as a "DES" (Develop Etch Strip) line. In a first stage of the DES line, a developing solution is sprayed onto the articles. The developing solution removes the non-hardened photoresist, leaving only the hardened polymer on the substrate. In a subsequent processing stage, the areas of the substrate not covered by the hardened polymer are etched by exposure to an etchant. In a still later stage, a chemical stripper is sprayed onto the articles to remove the hardened polymer. In similar processes, the exposed areas of the substrate are coated or plated with metal, rather than etched. However, as in the DES line, the coating or plating stage is preceded by a developing stage and followed by a stripping stage.

Waste solutions are produced in the developing and stripping stages. Typically, in printed circuit board manufacture, the waste solutions from both of these processing stages are alkaline solutions containing high concentrations of water-soluble photoresist material. The waste solutions have both a high chemical oxygen demand (COD) and a high biological oxygen demand (BOD). Before discharging such a waste solution to the environment, the solutions must be treated to remove organic materials and polymer skins.

In the past, DES lines were operated by circulating the developing and stripping solutions through "dead end" filters. That is, the chemicals were collected from the developing and stripping stages, passed through a filter medium, and returned to the spray heads. The accumulation of solids on the filter media required periodic interruption of the operation of the DES line for cleaning of the filters. The developer gradually deteriorated, with a resulting gradual reduction in the quality of the product. Moreover, the accumulation of dissolved polymer in the stripping solution gradually impaired its effectiveness and required the entire DES line to be operated more and more slowly over time until it was eventually shut down for replacement of the stripping solution.

The principal object of this invention is to provide an apparatus for recovering and recycling photoresist developing and stripping chemicals, which allows a photoresist processing apparatus to be operated continuously and at a high speed over long intervals.

Another object of the invention is to improve the efficiency of operation of photoresist processing equipment.

Still another object of the invention is to improve the quality of the products produced by the photoresist processing equipment.

The apparatus in accordance with the invention is an improved apparatus for processing articles to which a photoresist has been applied. It has a first circulatory flow path in which a photoresist developing or stripping liquid is circulated through a photoresist processing stage. It includes a liquid recovery system comprising a second circulatory flow path connected to receive a portion of the liquid from the first circulatory flow path. The second circulatory flow path includes a tangential filter. That is, at least a part of the second circulatory flow path is defined by a porous filter medium, so that a permeate passes out of the second circulatory flow path through the porous filter medium as liquid flows through the second circulatory flow path. The apparatus includes means for returning the permeate to the first circulatory flow path.

In a preferred embodiment, the apparatus further comprising means, in the second circulatory flow path, for accelerating polymerization of polymerizable material in the liquid flowing through the second circulatory flow path. This may include a heating means for heating liquid flowing through the second circulatory flow path and/or means for exposing polymerizable material in the liquid flowing through the second circulatory flow path to ultraviolet radiation.

Concentrated solids are removed from the second circulatory flow path through a drain, preferably from a collection tank forming part of the second circulatory flow path.

Preferably, means are provided for intermittently interrupting the flow of permeate through the porous filter medium and effecting a flow of liquid through the filter medium in the reverse direction while flow of liquid continues through the second circulatory flow path.

Thus, in the operation of the apparatus, the developing or stripping liquid is continuously circulated through the processing stage in the first flow path while a portion of the circulating liquid is taken out of the first flow path and passed to a second flow path where it is subjected to tangential filtration. The second flow path allows filtration to take place with a minimum of interruption to the operation the developing and stripping operations, and without the need for progressive slowing of the developing and stripping operations. This results in highly efficient operation and a high quality product.

Other objects, details and advantages of the invention will be apparent from the following detailed description when read in conjunction with the drawings.

DETAILED DESCRIPTION

Figure 1:
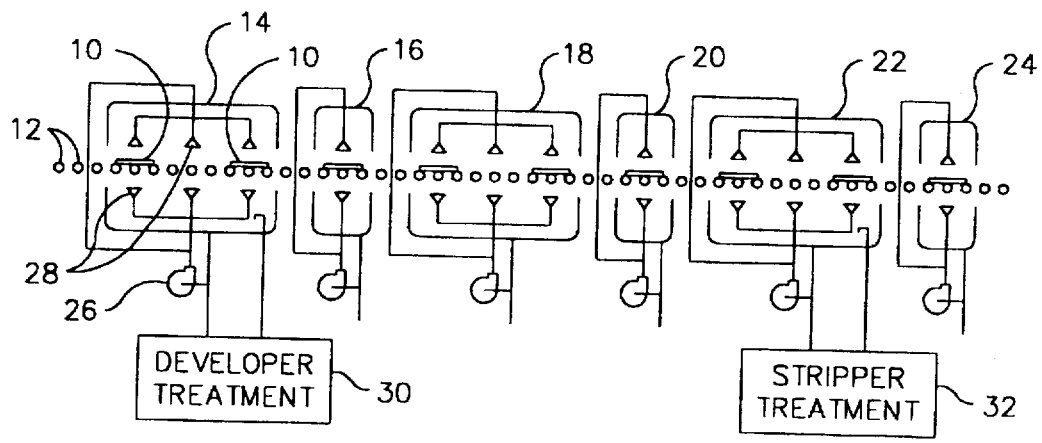
FIG. 1 is a schematic diagram of a DES line, in which both the developing and stripping stages are equipped with a recycling system in accordance with the invention.

As shown in FIG. 1, printed circuit boards 10 are carried by a conveyor made up of spaced, rotating rollers 12 through a series of enclosures 14, 16, 18, 20, 22 and 24. Enclosure 14 is the enclosure for a developing stage, in which a developing solution, typically a dilute solution of potassium bicarbonate, is circulated by a pump 26 through spray heads 28 above and underneath the rollers. The developing solution removes the unpolymerized photoresist, thereby exposing the metallic areas on the printed circuit boards that are to be etched in the etching stage.

Enclosure 18 is the enclosure of an etching stage, in which an etchant, typically an alkaline etchant, is circulated through spray heads and applied to the printed circuit boards to remove the metal in the exposed areas on the boards.

Enclosure 22 is the enclosure of a stripping stage, in which a stripping solution, typically a solution containing sodium hydroxide, methylethylamine, ethylenediamine and tetramethylammonium hydroxide, removes the polymerized film from the printed circuit boards, thereby exposing the remaining areas of metal, which are used as electrical conductors. The stripping solution is circulated in the stripping stage in the same manner in which it is circulated in the developing stage.

Enclosures 16, 20 and 24 are rinsing stages in which water is circulated.

A developer treatment apparatus 30 is associated with the developing stage, and a stripper treatment apparatus 32 is associated with the stripping stage. These treatment apparatuses cay be substantially identical to each other, although they may differ in certain respects as will be discussed below. Because the apparatuses 30 and 32 can be substantially identical, only one, the developer treatment stage 30 is shown in detail in FIG. 2.

Figure 2:
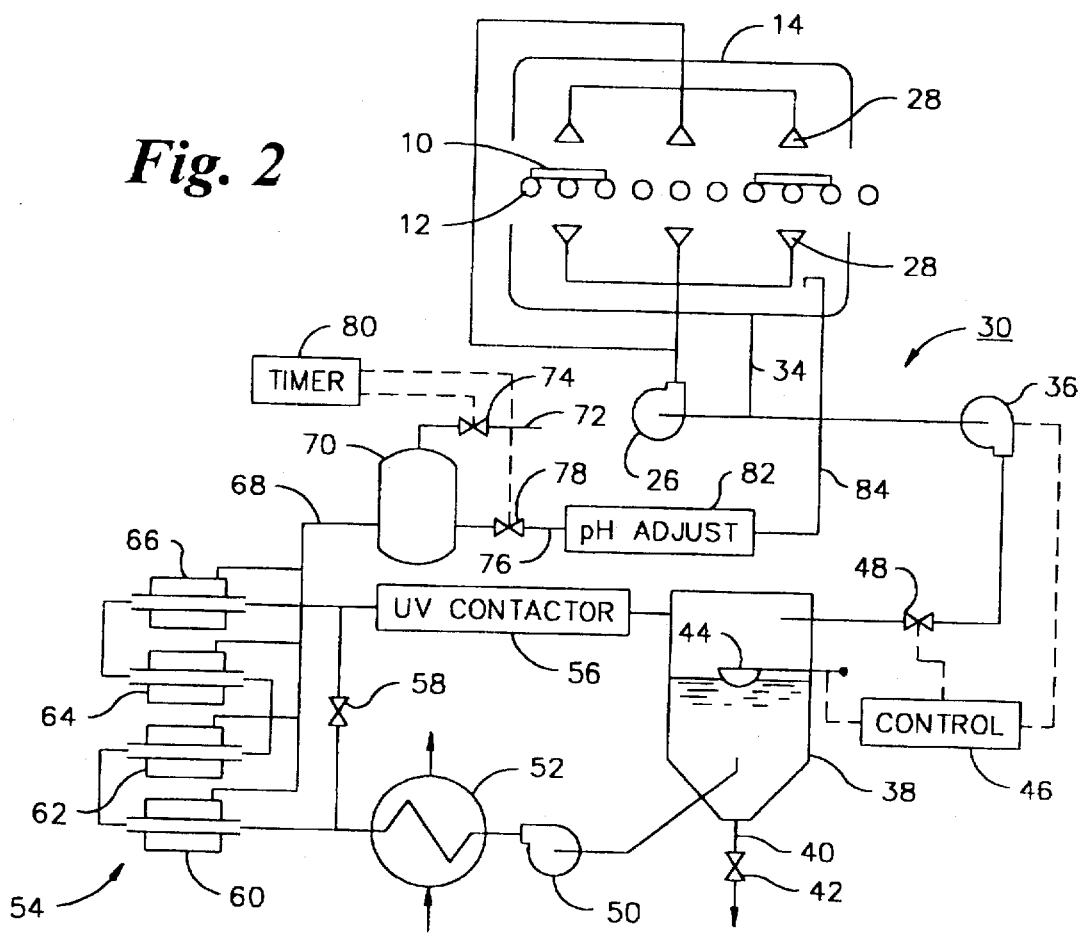
FIG. 2 is a schematic of the recycling system, which can be used with either the developer or the stripper.

Referring to FIG. 2, pump 26 receives developer collected at the bottom of enclosure 14 through line 34, and returns a portion of the developer to the spray heads 28. Thus, the pump 26 circulates developer in the developing stage through a first circulatory flow path.

Another portion of the developer is drawn from line 34 by a transfer pump 36. This path may include a coarse prefilter. The transfer pump 36 delivers developer to a collection tank 38 having a conical bottom and a drain line 40 with a valve 42. The collection tank has a float 44, which operates a control 46. This control operates both the pump 36 and a valve 48 to maintain the liquid level in tank 38 within predetermined limits.

A second circulatory flow path, in the developer treatment apparatus, comprises tank 38, a pump 50, a heat exchanger 52, a set 54 of filter modules and an ultraviolet contactor 56. Liquid is pumped through this flow path from the tank, and through the heat exchanger, filter modules and ultraviolet contactor back to the tank. A normally closed valve 58 is arranged to bypass the filter modules.

The set of filter modules consists of four tangential filtration modules 60, 62, 64 and 66, connected in series. Each comprises a porous tube, and the porous tubes of the filter modules together define a portion of the second circulatory flow path.

The porous tubes used in the filter modules 60–66 preferably incorporate a rigid mineral or metal porous support and an inner membrane of tough rare earth oxides or fluoropolymer, which can not only withstand back flushing but can also operate in high temperatures and withstand rigorous chemical cleaning when necessary. This avoids the failures experienced in ultrafiltration and microfiltration using membranes of polymer composites, which tend to foul easily and typically are not robust enough to withstand back flushing. The filter element may be of the kind described in Hoover et al. U.S. Pat. No. 4,069,157, dated Jan. 17, 1978, the disclosure of which is here incorporated by reference. Suitable ultrafiltration and microfiltration membranes are well-known to those skilled in the art and are available from sources such as U. S. Filter, Rhone Poulenc, Graver Separations and CeraMem Separations as well as from other sources.

Surrounding each porous tube is a collector arranged to receive the permeate passing outwardly from the second flow path through the porous tubes. The collectors are connected in parallel and through line 68 to a pressurizable tank 70 having an air line 72 with a valve 74, and an outlet line 76 having a valve 78. Both valves 74 and 78 are controlled by timer 80, Line 76 is connected through a pH adjuster 82 to a return line 84, which delivers pH-adjusted permeate back to the enclosure 14, where it is returned to the first circulatory flow path.

Pump 50 typically maintains a pressure in the range of 30 to 100 psi in the flow path through the filter modules. The size of filter modules is determined on the basis of the desired flow of clear permeate.

As will be apparent from the above description of the apparatus, the solutions are subjected to heat, ultraviolet irradiation, and rigid rare earth oxide membrane filtration with intermittent back flushing.

The heat applied by heat exchanger 52 helps accelerate the polymerization of unaged photoresist-laden working solutions. When using elevated temperatures, caution should be exercised in order not to exceed the maximum temperature that the conveyer machinery can withstand. If necessary, more temperature-tolerant machinery can be used, or the solution can be cooled down before being put back into service.

As the solution flows through the series of filter modules, the pressure applied to the solution by the circulation pump 50 causes a permeate stream to pass through the filter membrane, leaving a concentrated stream flowing toward the collection tank 38. The permeate is returned after pH adjustment back to developing or the stripping process.

The concentrate then passes through the ultraviolet light radiation contactor 56, where the resist skins are further hardened and sent back into collection tank 38. When a predetermined concentration of waste solution and skins is reached, material is drained from the bottom of tank 38 and disposed of in accordance with applicable laws.

An advantage of the tangential filtration is that the flow of liquid through the filter modules prevents solids from building up on the filter medium. Consequently, the filter modules can be operated efficiently over long periods of time.

Even under ideal conditions, a thin layer of filter cake will form on the filter medium, and will tend to impair the efficiency of the filtration. To ensure that the filter modules continue to operate efficiently, the permeate flow through tank 70 is intermittently stopped and reversed. Tank 70 is pressurized by the flow of air into it through line 72 for a short period of time to facilitating the reverse flow of the permeate through the filter membrane. This reverse flow clears away filter cake and other obstructions, maintaining a high permeate flow rate. The intermittent reverse flow through the filter media can take place without interrupting circulation of liquid through the circulatory path comprising the filters, collection tank 38, the heat exchanger 52 and the ultraviolet contactor 56.

By-pass valve 58, when opened, allows the filter modules to be repaired or replaced. It may also be opened to circulate developing solution through the ultraviolet contactor 56 without passing it through the filter modules, so that the particles carried by the circulating developing solution can be hardened more effectively by ultraviolet radiation. This reduces the likelihood of blinding of the filter modules when flow through the filter modules is restored.

The apparatus in accordance with the invention can be used to processes various photoresist-containing solutions from the developing or stripping stage of a photo-imaging process such as used in the manufacture of printed circuit boards, chemical milling, semiconductor manufacture, and printing. The invention allows these solutions to be processed continuously over a long period of time under steady state conditions.

The invention represents a significant departure from the conventional methods for processing photoresist-laden developing and stripping solutions. Instead of the conventional batch process, in which working solutions are used until spent, the invention affords steady-state process in which the photoresist polymer (skins) are rapidly and continuously removed, rendering the working solution immediately and continuously reusable. This steady-state processing does not allow the polymer, or the dye in the polymer, time to react with or dissolve into the developing solution or stripping solution. This not only reduces the amount of fresh solution necessary, but avoids the nozzle clogging and sump cleaning problems that are experienced in the operation of conventional equipment. It also allows continued operation at the higher conveyer speeds that are typically possible with fresh solution.

This invention employs several technologies together. Rigid porous membranes made from ceramics, carbon, or stainless steel support various rare earth-impregnated oxides using sol-gel process to achieve a very low fouling, back flushable, and high temperature, stable ultrafiltration or microfiltration modules.

These modules, in combination with the heat exchanger, ultraviolet light contactor, and the intermittent back flushing mechanism, make possible a continuous process for recycling photoresist developer and stripper solution immediately back to service, while generating a highly concentrated waste.

This apparatus can be assembled from parts and components that are commonly available and known to those skilled in the art.

Various modifications can be made to the apparatus described, and to the method of its operation. For example, the processing unit can be located immediately adjacent to the developing or stripping apparatus which it serves, or can be remotely located and connected by piping to the appropriate developer or stripper machinery. In the case of recycling of developer, the heat exchanger, although desirable for promoting polymerization, can be eliminated. Similarly, in the recycling of stripper solution, the ultraviolet contactor, although desirable for eliminating tackiness in the filtered solids, can be eliminated. If desired, the processing unit can also operate in a batch treatment mode, and can be located anywhere space permits, even in a waste treatment area.

Still other modifications may be made to the apparatus and method described above without departing from the scope of the invention as defined in the following claims.

I claim:

1. In an apparatus for processing articles to which a photoresist has been applied, the apparatus having a first circulatory flow path in which a liquid from the group consisting of photoresist developing and stripping liquids is circulated through a photoresist processing stage, a liquid recovery system comprising:

a second circulatory flow path connected to receive a portion of the liquid from the first circulatory flow path, at least a part of the second circulatory flow path being defined by a porous filter medium, whereby a permeate passes out of the second circulatory flow path through the porous filter medium as liquid flows through the second circulatory flow path; and means for carrying the permeate passing out of the second circulatory flow path through the porous filter medium to the first circulatory flow path.

2. Apparatus according to claim 1 further comprising means, in the second circulatory flow path, for accelerating polymerization of polymerizable material in the liquid flowing through the second circulatory flow path.

3. Apparatus according to claim 1 further comprising means for heating liquid flowing through the second circulatory flow path.

4. Apparatus according to claim 1 further comprising means for exposing polymerizable material in the liquid flowing through the second circulatory flow path to ultraviolet radiation.

5. Apparatus according to claim 1 further comprising means applying both heat and ultraviolet radiation to liquid flowing through the second circulatory flow path.

6. Apparatus according to claim 1 including a drain for removing concentrated solids from the second circulatory flow path.

7. Apparatus according to claim 1 in which the second circulatory flow path includes a collection tank and a drain in the collection tank for removing concentrated solids from the second circulatory flow path.

8. Apparatus according to claim 1 including means for intermittently interrupting the flow of permeate through the porous filter medium and effecting a flow of liquid through the filter medium in the reverse direction while flow of liquid continues through the second circulatory flow path.

9. Apparatus according to claim 1 further comprising means, in the second circulatory flow path, for accelerating polymerization of polymerizable material in the liquid flowing through the second circulatory flow path, and also including a valved by-pass path permitting circulation of liquid through the accelerating means without flowing through the part of the second circulatory flow path defined by a porous filter medium.

10. A method of processing articles to which a photoresist has been applied, comprising the steps of:

circulating a liquid from the group consisting of photoresist developing and stripping liquids through a photoresist processing stage in a first circulatory flow path;

passing a portion of said liquid from the first circulatory flow path into a second circulatory flow path at least a part of which is defined by a porous filter medium;

causing said portion of said liquid to circulate through the second circulatory flow path, whereby a permeate passes out of the second circulatory flow path through the porous filter medium; and carrying the permeate passing out of the second circulatory flow path through the porous filter medium to the first circulatory flow path.

11. The method according to claim 10 in which the liquid flowing through the second circulatory flow path is passed through means, in the second circulatory flow path, for accelerating polymerization of polymerizable material.

12. The method according to claim 10 in which the liquid flowing through the second circulatory flow path is passed through heating means in the second circulatory flow path.

13. The method according to claim 10 in which the liquid flowing through the second circulatory flow path is exposed to ultraviolet radiation in the second circulatory flow path.

14. The method according to claim 10 in which the liquid flowing through the second circulatory flow path is exposed to both heat and ultraviolet radiation in the second circulatory flow path.

15. The method according to claim 10 in which concentrated solids are removed from the second circulatory flow path.

16. The method according to claim 10 in which the second circulatory flow path includes a collection tank and a drain in the collection tank for removing concentrated solids from the second circulatory flow path.

17. The method according to claim 10 in which the flow of permeate through the porous filter medium is interrupted intermittently and in which a flow of liquid is effected through the filter medium in the reverse direction while flow of liquid continues through the second circulatory flow path.

18. The method according to claim 10 in which the liquid flowing through the second circulatory flow path is passed through means, in the second circuatory flow path, for accelerating polymerization of polymerizable material, and in which, before circulating liquid through the part of the second circulatory flow path defined by the porous filter medium, liquid is circulated through the accelerating means without flowing through said part of the second circulatory flow path.

* * * * *